(12) United States Patent
Matsuura et al.

(10) Patent No.: US 6,906,367 B2
(45) Date of Patent: Jun. 14, 2005

(54) SEMICONDUCTOR DEVICE AND METHOD OF FABRICATING THE SAME

(75) Inventors: Osamu Matsuura, Kawasaki (JP); Kenji Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/635,648

(22) Filed: Aug. 7, 2003

(65) Prior Publication Data

US 2004/0033672 A1 Feb. 19, 2004

(30) Foreign Application Priority Data

Aug. 13, 2002 (JP) .......................................... 2002-235847

(51) Int. Cl.$^7$ .......................... H01L 29/76; H01L 29/94; H01L 31/062; H01L 31/113; H01L 31/119
(52) U.S. Cl. ...................................................... 257/295
(58) Field of Search ............................ 257/295, 68, 69, 257/288, 296, 306, 613, 614, 615

(56) References Cited

U.S. PATENT DOCUMENTS 6,190,957 B1 * 2/2001 Mochizuki et al. ......... 438/240
6,649,954 B2 * 11/2003 Cross ........................ 257/295

* cited by examiner

Primary Examiner—David Nhu
(74) Attorney, Agent, or Firm—Westerman, Hattori, Daniels & Adrian, LLP

(57) ABSTRACT

After a MOS transistor is formed on a semiconductor substrate, an Ir film, LT film, PZT film, and $IrO_2$ film are formed in this order on the entire surface. Although the LT film itself is not a ferroelectric film, a ferroelectric film is formed by a stacked film of the LT film and PZT film. In a ferroelectric capacitor having this ferroelectric film, the LT film does not contain Pb, so the alignment can be readily controlled during the film formation. This raises the alignment of the LT film. The crystal structure of the LT film is a perovskite structure similar to that of the PZT film. Since the PZT film is formed on this LT film, the alignment of the LT film is taken over when the PZT film is grown. This raises the alignment of the PZT film.

9 Claims, 5 Drawing Sheets

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2002-235847, filed on Aug. 13, 2002, the entire contents of which are incorporated herein by reference.

BACKGROUND OF THE INVENTION

1. Field of the Invention

The present invention relates to a semiconductor device including a ferroelectric capacitor and suited to a nonvolatile memory or the like, and a method of fabricating the semiconductor device.

2. Description of the Related Art

A ferroelectric material is applied to a memory (semiconductor memory), actuator, sensor, and the like since the material has high ferroelectricity, piezoelectricity, and pyroelectricity. As for a memory, this material is applicable to a nonvolatile memory by using the hysteresis of ferroelectricity. These semiconductor devices use a capacitor structure made up of a lower electrode, ferroelectric film, and upper electrode stacked in this order on a lower layer. As the ferroelectric film, $Pb(Zr, Ti)O_3$ (to be also referred to as PZT hereinafter) having higher ferroelectricity than other ferroelectric materials is mainly used. As a method of forming this ferroelectric film, a sol-gel method, sputtering, CVD (Chemical Vapor Deposition), or the like is used.

When a thin PZT film is formed using sputtering or CVD, however, the initial nucleation density of PZT on a lower layer is low, and this produces variations in grain size. As a countermeasure against this problem, a method is reported in, e.g., "Jpn. J. Applied. Phys., Vol. 32, No. 9B, pp. 4086–4088 (1993)". In this method, an initial layer of $PbTiO_3$ is formed on an electrode in advance, and a PZT film is formed after that.

Unfortunately, even when the initial layer of $PbTiO_3$ is formed as in the above conventional film formation method, it is impossible to well control the alignment of a PZT film formed on this initial layer. If this alignment is low, high remanent polarization is difficult to obtain, so no high reliability can be obtained.

SUMMARY OF THE INVENTION

The present invention has been made in consideration of the above problem, and has as its object to provide a semiconductor device by which high reliability can be obtained by ensuring high alignment in a ferroelectric film, and a method of fabricating the same.

The present inventors made extensive studies and have found that even when an initial layer is used to control a crystal, if a ferroelectric material containing Pb is used in this initial layer, PbO evaporates during film formation because the vapor pressure of PbO is high. This makes the alignment in the thin initial layer difficult to control and, as a consequence, makes it impossible to well control the alignment of a PZT film to be formed on the initial layer. To eliminate this cause, the present inventors have reached various aspects of the present invention shown below.

In a semiconductor device fabrication method according to the present invention, after a lower electrode is formed above a semiconductor substrate, a base film having a perovskite crystal structure containing La and not containing Pb is formed on the lower electrode. After that, a ferroelectric film having a perovskite crystal structure containing Pb is formed on the base film. An upper electrode is formed on the ferroelectric film.

By this semiconductor device fabrication method, a semiconductor device is obtained which has a semiconductor substrate, a lower and upper electrodes formed above the semiconductor substrate, and a ferroelectric film sandwiched between the lower and upper electrodes and having a perovskite crystal structure. In this semiconductor device, the ferroelectric film has an La-containing region which is in contact with the lower electrode and contains La, and a Pb-containing region which is present on the La-containing region and contains Pb. Also, the La concentration in the lowermost surface of the La-containing region is higher than that in the uppermost surface of the Pb-containing region.

In the present invention, after a base film having a perovskite crystal structure is formed on a lower electrode, a ferroelectric film containing Pb is formed on the base film, and a film containing La and not containing Pb is used as the base film. Therefore, the vapor pressure does not rise unlike when a Pb-containing film is formed, so a base film having high alignment can be formed. Since this alignment restrains the alignment of the ferroelectric film formed on the base film, the alignment of the ferroelectric film also improves. Accordingly, when the present invention is applied to, e.g., a nonvolatile semiconductor memory, a high-performance ferroelectric memory can be fabricated with high reliability.

In this specification, a "ferroelectric film" does not necessarily indicate only a film exhibiting ferroelectricity all portions of itself, but includes a stacked film which is made up of a film not showing ferroelectricity and a film showing ferroelectricity, and which exhibits ferroelectricity as a whole. Likewise, a film which is not a stacked film but shows ferroelectricity as a whole is included in a ferroelectric film.

DETAILED DESCRIPTION OF THE PREFERRED EMBODIMENT

Figure 1:
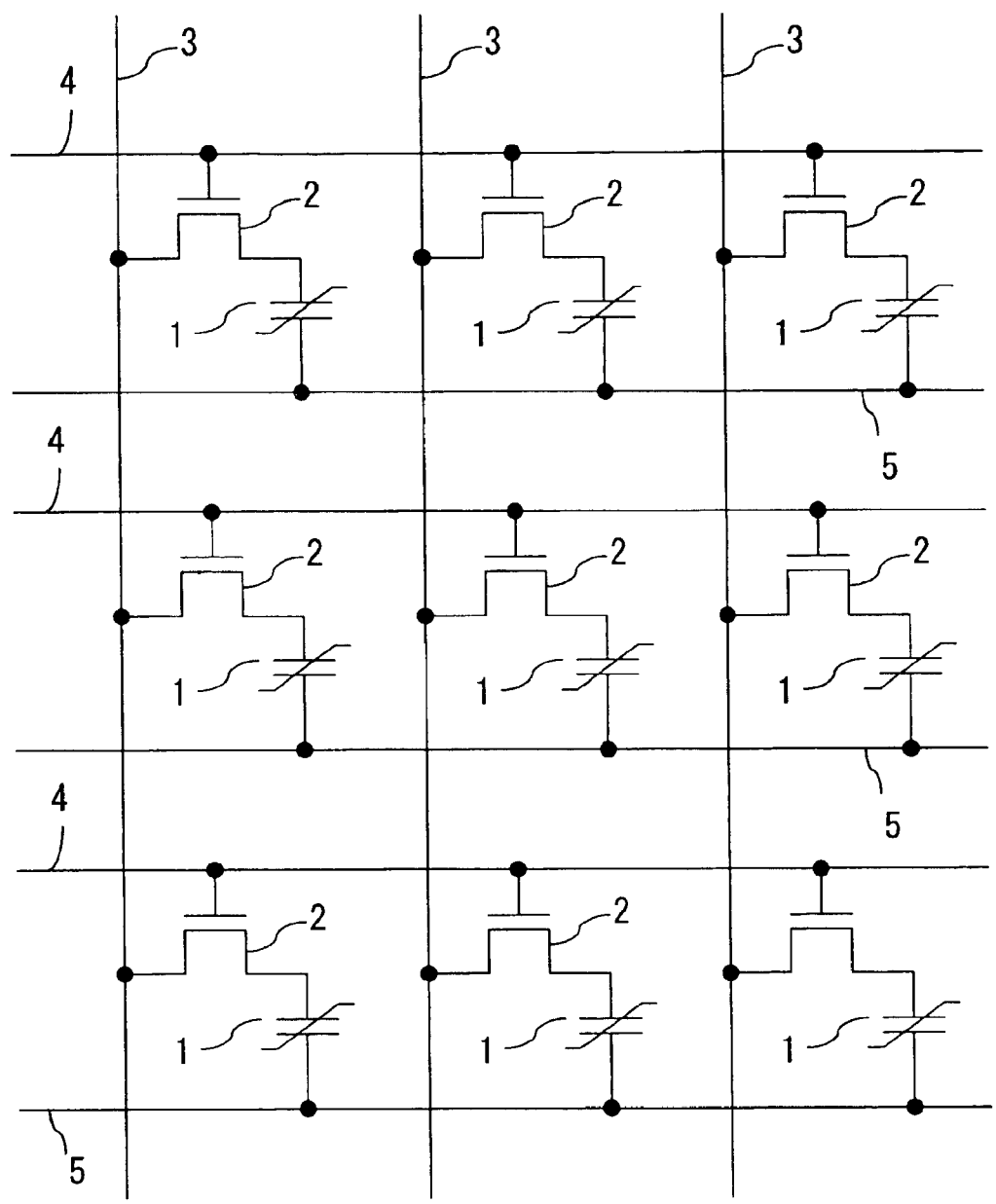
FIG. 1 is a circuit diagram showing the arrangement of a memory cell array of a ferroelectric memory (semiconductor device) according to an embodiment of the present invention.

A semiconductor device and a method of fabricating the same according to an embodiment of the present invention will be described in detail below with reference to the accompanying drawings. FIG. 1 is a circuit diagram showing the arrangement of a memory cell array of a ferroelectric memory (semiconductor device) according to the embodiment of the present invention.

This memory cell array has a plurality of bit lines 3 that run in one direction, and a plurality of word lines 4 and plate lines 5 that run in a direction perpendicular to the direction in which the bit lines 3 run. Also, a plurality of memory cells of the ferroelectric memory according to the present embodiment are arranged in the form of an array so as to match the lattice formed by the bit lines 3, word lines 4, and plate lines 5. Each memory cell has a ferroelectric capacitor 1 and MOS transistor 2.

The gate of this MOS transistor 2 is connected to the word line 4. One source/drain of the MOS transistor 2 is connected to the bit line 3, and the other source/drain is connected to one electrode of the ferroelectric capacitor 1. The other electrode of this ferroelectric capacitor 1 is connected to the plate line 5. Each word line 4 and plate line 5 are shared by a plurality of MOS transistors 2 arranged in the direction in which these word line 4 and plate line 5 run. Similarly, each bit line 3 is shared by a plurality of MOS transistors 2 arranged in the direction in which this bit line 3 runs. The direction in which the word lines 4 and plate lines 5 run and the direction in which the bit lines 3 run are sometimes also called a row direction and a column direction, respectively.

In the memory cell array of the ferroelectric memory constructed as above, data is stored in accordance with the polarized state of a ferroelectric film formed in the ferroelectric capacitor 1.

The structure of each memory cell of the ferroelectric memory as described above will be explained below. For the sake of convenience, the structure of each memory cell will be explained together with its fabrication method. FIGS. 2A to 2G are sectional views showing the method of fabricating the ferroelectric memory (semiconductor device) according to the embodiment of the present invention in order of steps. Note that FIGS. 2A to 2G illustrate a portion corresponding to two MOS transistors sharing one bit line (corresponding to the bit line 3 shown in FIG. 1).

Figure 2A:
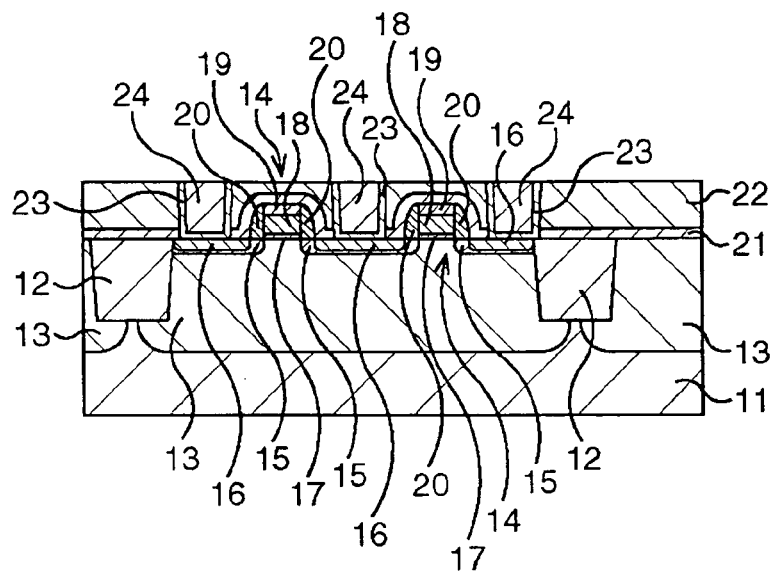
FIGS. 2A to 2G are sectional views showing a method of fabricating the ferroelectric memory according to the embodiment of the present invention in order of steps.

First, as shown in FIG. 2A, element isolation regions 12 are formed by, e.g., STI (Shallow Trench Isolation) in the surface of a semiconductor substrate 11 such as a silicon substrate. In an element active region defined by these element isolation regions 12, a well 13 is formed in the surface of the semiconductor substrate 11. Subsequently, gate insulating films 17, gate electrodes 18, silicide layers 19, low-concentration diffusion layers 15, side walls 20, and high-concentration diffusion layers 16 are formed on the surface of the well 13, thereby forming MOS transistors 14. These MOS transistors 14 correspond to the MOS transistors 2 shown in FIG. 1. Note that the two high-concentration regions 16 for a source and drain are formed for each MOS transistor 14, and one of them is shared by two MOS transistors 14.

A silicon oxynitride film 21 is then formed on the entire surface so as to cover the MOS transistor 14. In addition, a silicon oxide film 22 is formed on the entire surface by, e.g., organic CVD. The silicon oxynitride film 21 is formed to prevent hydrogen-induced degradation of the gate insulating films 17 and the like when the silicon oxide film 22 is formed. After that, contact holes reaching the individual high-concentration diffusion layers 16 are formed in the silicon oxide film 22 and silicon oxynitride film 21, thereby opening plug contact portions. After a barrier metal film 23 is formed in these contact holes, a W film is buried by CVD or the like and planarized by CMP (Chemical Mechanical Polishing), thereby forming W plugs 24.

Figure 2B:
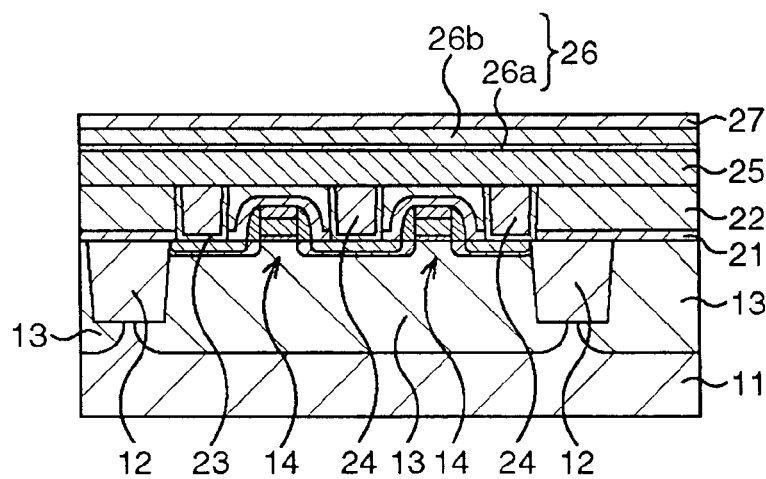

As shown in FIG. 2B, an Ir film 25, LaTiO$_3$ (to be also referred to as LT hereinafter) film 26a, PZT film 26b, and IrO$_2$ film 27 are formed in this order on the entire surface. Both the LT film 26a and PZT film 26b have a perovskite crystal structure. The Ir film 25 can also be formed to have a thickness of 200 nm by, e.g., sputtering. The LT film 26a can also be deposited to have a thickness of 10 nm by, e.g., MOCVD. The alignment of the film when MOCVD is used is superior to that when sputtering is used. Since film formation using MOCVD increases the density of a film, high film alignment can be obtained even when the film is thin. The LT film itself is not a ferroelectric film. To maintain the ferroelectricity of PZT, therefore, it is preferable to make the LT film as thin as possible. When this LT film is formed using MOCVD in the present invention, the ferroelectricity of PZT can be maintained while the thickness of the LT film is thin. In this embodiment, the LT film has a thickness of 10 nm. When the film thickness is 20 nm or less, the effect of obtaining high alignment is more remarkable when MOCVD is used than when sputtering is used.

The PZT film 26b can also be formed to have a thickness of 110 nm by, e.g., MOCVD. The IrO$_2$ film 27 can also be formed to have a thickness of 200 nm by, e.g., sputtering. Although the LT film 26a is not a ferroelectric film, the ferroelectric film 26 is formed by a stacked film of the LT film 26a and PZT film 26b in this embodiment.

Note that these series of film formation steps are favorably performed continuously in the same chamber without taking out the semiconductor substrate 11 from the chamber, so as not to expose the formed films to the atmosphere, particularly water vapor. That is, these film formation steps are preferably performed in-situ. It is particularly favorable to continuously form the LT film 26a and PZT film 26b.

Figure 2C:
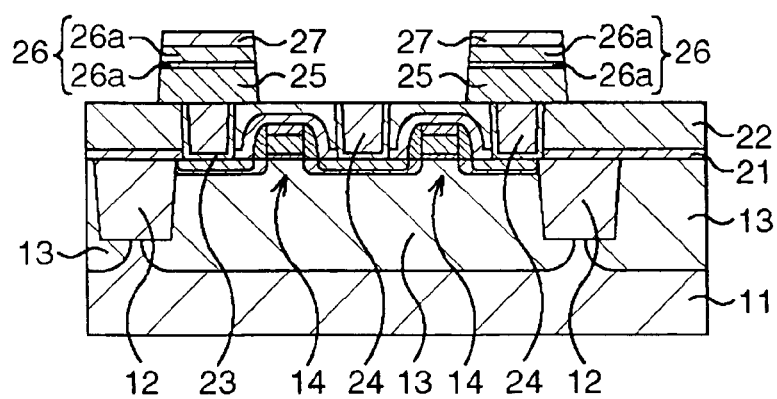

Subsequently, as shown in FIG. 2C, patterning and etching are used to process the IrO$_2$ film 27, ferroelectric film 26, and Ir film 25, thereby forming ferroelectric capacitors each having a stacked structure in which the ferroelectric film 26 is sandwiched between the IrO$_2$ film 27 as an upper electrode and the Ir film 25 as a lower electrode. These ferroelectric capacitors correspond to the ferroelectric capacitors 1 shown in FIG. 1.

Figure 2D:
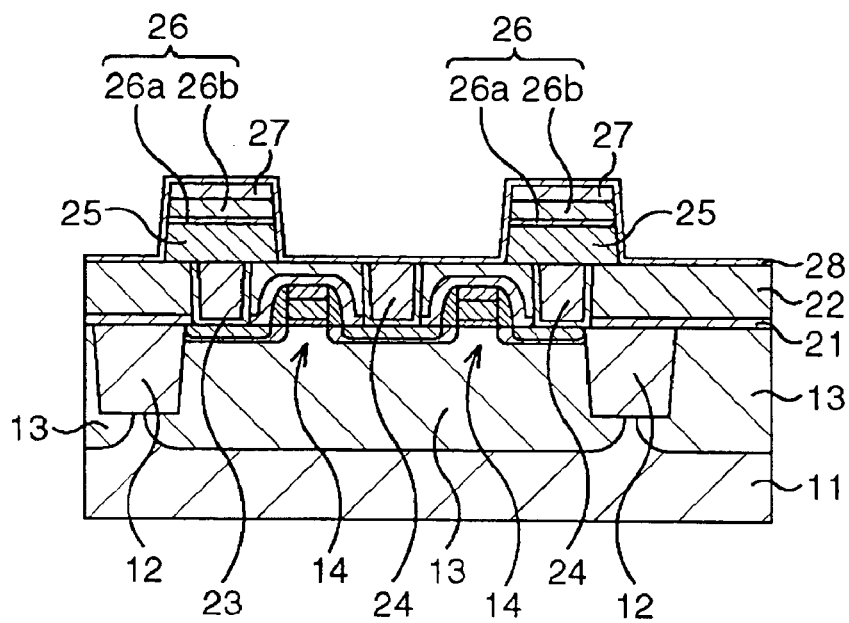

As shown in FIG. 2D, an alumina protective film 28 covering the ferroelectric capacitors is formed on the entire surface, and furnace annealing is performed in an O$_2$ atmosphere at, e.g., 650° C. for 60 min.

Figure 2E:
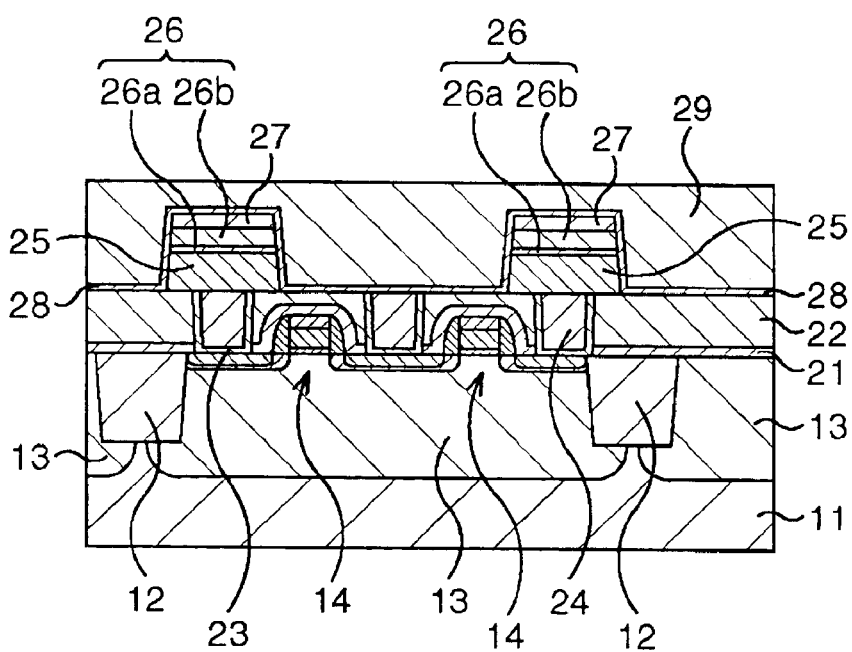

As shown in FIG. 2E, a dielectric interlayer 29 is formed on the entire surface and planarized by CMP. As this dielectric interlayer 29, a silicon oxide film can also be formed by using, e.g., an HDP(High Density Plasma)CVD system. A TEOS (TetraEthyl OrthoSilicate) oxide film can also be formed as the dielectric interlayer 29.

Figure 2F:
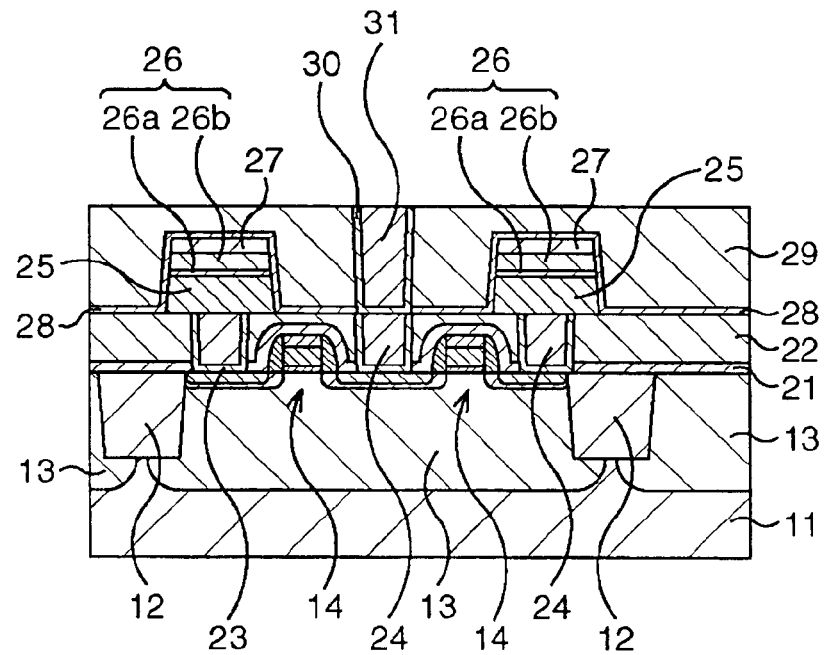

Subsequently, as shown in FIG. 2F, patterning and etching are used to form a contact hole in the dielectric interlayer 29 and alumina protective film 28. This contact hole reaches the W plug 24 connected to the high-concentration diffusion layer 16 shared by the two MOS transistors 14. After a barrier metal film 30 is formed in this contact hole, a W film is buried by CVD or the like and planarized by CMP (Chemical Mechanical Polishing), thereby forming a W plug 31. After that, the surfaces of the dielectric interlayer 29 and W plug 31 are exposed to N$_2$ plasma at, e.g., 350° C. The plasma processing time is, e.g., 120 sec.

Figure 2G:
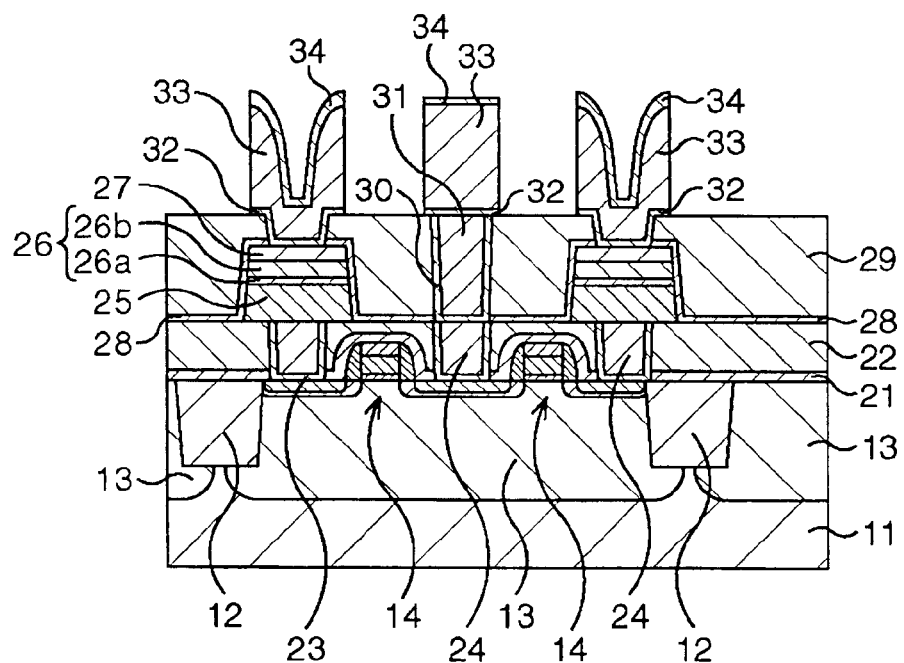

A W anti-oxidizing film (not shown) is then formed on the entire surface. This W anti-oxidizing film can be, e.g., an SiON film, and the thickness of the film is, e.g., about 100 nm. As shown in FIG. 2G, patterning and etching are used to form contact holes in the W anti-oxidizing film and dielectric interlayer 29. These contact holes reach the IrO$_2$ films 27 as upper electrodes. Subsequently, annealing for recovering damage by the etching is performed. This annealing can be furnace annealing in an O$_2$ atmosphere at, e.g., 500° C., and the annealing time is, e.g., 60 min. After this annealing, the W anti-oxidizing film is removed by etch back.

Then, a barrier metal film, wiring material film, and barrier metal film are deposited in this order. For example, the lower barrier metal layer is a stacked film of a 70-nm thick TiN film and 5-nm thick Ti film, the wiring material film is a 400-nm thick Al—Cu alloy film, and the upper barrier metal film is a stacked film of a 30-nm thick TiN film and 60-nm thick Ti film.

An antireflection film (not shown) is formed on the upper barrier metal film and coated with a resist film. Subsequently, the resist film is so processed as to match wiring patterns. The processed resist film is used as a mask to etch the antireflection film, barrier metal film, wiring material film, and barrier metal film. The antireflection film can be, e.g., an SiON film, and the thickness of the film is, e.g., about 30 nm. By this etching, as shown in FIG. 2G, barrier metal films 32, wirings 33, and barrier metal films 34 are formed.

After that, dielectric interlayers, contact plugs, and wirings on and after the second lowest layer are formed. A covering film made up of, e.g., a TEOS oxide film and SiN film is formed to complete a ferroelectric memory having ferroelectric capacitors. In the formation of the upper wirings, the wirings 33 connected to the $IrO_2$ films 27 as upper electrodes are connected to plate lines, and the wiring 33 connected to the high-concentration diffusion layer 16 shared by the two MOS transistors 14 is connected to a bit line. Each gate electrode 18 itself can be used as a word line or connected to a word line in the upper wiring layer.

In this embodiment as described above, the LT film 26a is formed on the Ir film 25 serving as a lower electrode before the PZT film 26b is formed. Since this LT film 26a contains no Pb, the vapor pressure does not rise. Therefore, the alignment can be easily controlled during the film formation. That is, the LT film 26a having high alignment can be formed. Also, the crystal structure of this LT film 26a is the same perovskite structure as the PZT film 26b. Since the PZT film 26b is formed on this LT film 26a, the alignment of the LT film 26a is taken over when the PZT film 26b is grown. Consequently, the PZT film 26b having high alignment is obtained.

Figure 3:
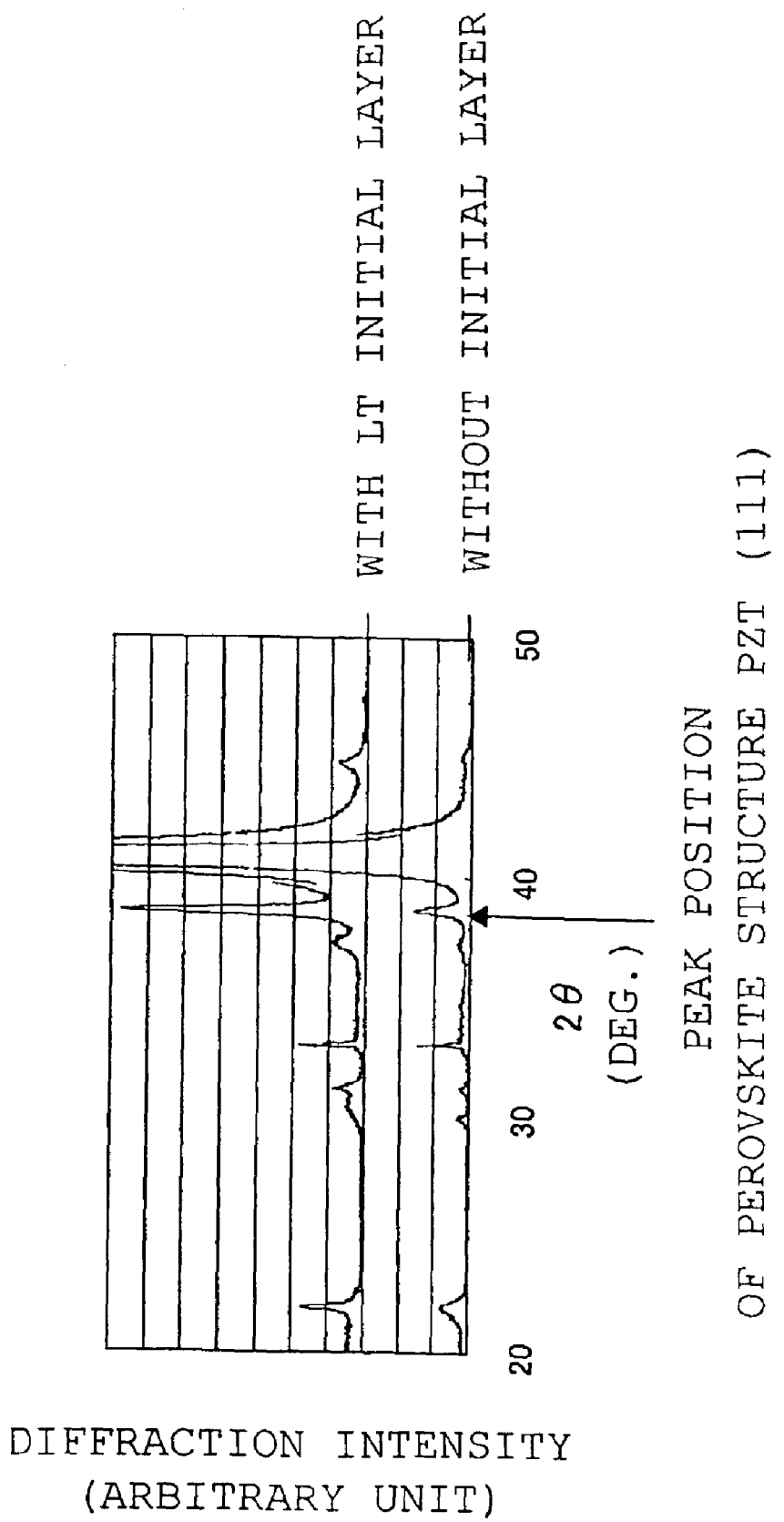
FIG. 3 is a graph showing the results of evaluation of the alignment by X-ray diffraction (XRD).

FIG. 3 is a graph showing the results of evaluation of alignment by X-ray diffraction (XRD). The alignment of a crystal is evaluated from a portion where the diffraction intensity is high, by plotting the diffraction intensity (arbitrary units) on the ordinate and 2θ (degrees) on the abscissa. The present inventors actually measured the (111) peak intensity of perovskite structure PZT for a sample (having an LT initial layer) in which a ferroelectric film was made up of an LT film and PZT film, and for a sample (having no initial layer) in which a ferroelectric film was made up of only a PZT film. As shown in FIG. 3, the peak intensity was about 2.5 in the conventional sample "having no initial layer". In contrast, the peak intensity was about 7 in the sample "having an LT initial layer" according to the embodiment of the present invention. That is, a PZT (111) alignment three times as large as the conventional device was obtained in this embodiment.

In the ferroelectric capacitor fabricated in the above embodiment, the LT film 26a and PZT film 26b are clearly separated, and the boundary is also clear. However, Pb and Zr in PZT may diffuse into the LT film 26a during the formation of the PZT film 26b. That is, the boundary between the LT film 26a and PZT film 26b blurs. In this case, if the ferroelectric film 26 is defined into an La-containing region which is in contact with the Ir film 25 as a lower electrode and contains La, and a Pb-containing region which is present on this La-containing region and contains Pb, the La concentration in the lowermost surface of the La-containing region is higher than that in the uppermost surface of the Pb-containing region. Even in a case like this, the effects of the present invention can be obtained as long as the alignment of the LT film 26a itself does not lower as a result of diffusion. On the contrary, the total ferroelectricity of the ferroelectric film 26 may improve because the region having ferroelectricity expands along with Pb diffusion.

If no such diffusion as described above occurs, no La is present in the uppermost surface of the Pb-containing region since this region is made of the PZT film 26b. Even when this diffusion occurs, however, La in the LT film 26a does not easily reach the uppermost surface of the Pb-containing region, so no La is in many cases present in the uppermost surface of this Pb-containing region.

Furthermore, when no diffusion takes place, the La concentration is substantially constant in the direction of thickness in the LT film 26a. On the other hand, if diffusion of Pb and Zr occurs, La in the LT film 26a slightly diffuses into the PZT film 26b. Consequently, the La concentration in the La-containing region monotonically reduces from the lowermost surface (in contact with the Ir film 25 as a lower electrode) toward the $IrO_2$ film 27 as an upper electrode.

Although the LT film 26a is formed by MOCVD in the above embodiment, this LT film 26a may also be formed by a sol-gel method or sputtering. However, MOCVD is preferred because a thin dense film can be formed.

In addition, a film formed on the LT film is not limited to the PZT film provided that the film has a perovskite structure and shows ferroelectricity. For example, it is also possible to form a ferroelectric film by forming, on the LT film, (Pb, La)(Zr, Ti)$O_3$ (also called PLZT) formed by doping PZT with La, (Pb, Ca)(Zr, Ti)$O_3$ (also called PCZT) formed by doping PZT with Ca, (Pb, Sr)(Zr, Ti)$O_3$ (also called PSZT) formed by doping PZT with Sr, (Pb, La, Ca)(Zr, Ti)$O_3$ (also called PLCZT) formed by doping PZT with La and Ca, (Pb, La, Sr) (Zr, Ti)$O_3$ (also called PLSZT) formed by doping PZT with La and Sr, (Pb, Ca, Sr)(Zr, Ti)$O_3$ (also called PCSZT) formed by doping PZT with Ca and Sr, or (Pb, La, Cs, Sr) (Zr, Ti)$O_3$ (also called PLCSZT) formed by doping PZT with La, Sr, and Ca. La, Ca, and Sr are elements positioned in A site of the perovskite structure. However, a ferroelectric film may also be formed by forming, on the LT film, a film obtained by doping PZT with Nb or Mn present in B site.

Compared to the PZT film, the La-doped film has the effects of improving the fatigue characteristics and reducing the leakage current. Also, compared to the PZT film, the Ca- and/or Sr-doped film has the effect of preventing easy occurrence of hydrogen-induced degradation. These effects are effective when a ferroelectric capacitor is applied to a ferroelectric memory. Furthermore, compared to the PZT film, the Nb- or Mn-doped film has the effect of improving the piezoelectricity. This effect is effective when a ferroelectric capacitor is applied to a piezoelectric element.

A semiconductor device to which the present invention is applied is not restricted to the ferroelectric memory and piezoelectric element described above. That is, the present invention is applicable to any device including a ferroelectric capacitor. For example, the device structure of the present invention can be applied to an infrared sensor by using the pyroelectricity of a ferroelectric film having a perovskite crystal structure. Here, when the present invention is applied to an infrared sensor, it is not always necessary to decrease the thickness of the LT film in order to improve the capacitor characteristics. On the contrary, the LT film is preferably thick when the ease of manufacture of an infrared sensor is taken into consideration.

Furthermore, the electrode structure is not particularly limited. For example, a lower electrode having a staked structure of a Pt film and Ti film may also be used. If this stacked structure of a Pt film and Ti film is used, the crystallinity relatively improves. However, it is difficult to completely prevent diffusion of Pb in the ferroelectric film when the stacked structure of a Pt film and Ti film is used. Therefore, if a countermeasure for preventing diffusion of Pb is adapted, a lower electrode having this stacked structure of a Pt film and Ti film can be used. In other words, when the arrangement of the above embodiment is used, the problem of Pb diffusion in the ferroelectric film can be completely solved.

Although the thickness of the LT film formed as an initial layer is not particularly restricted, this thickness is favorably as small as possible provided that high alignment can be ensured, for the reason explained below. The LT film shows no ferroelectricity as described above. If this film is too thick, therefore, of the voltage applied between the upper and lower electrodes, a voltage applied to this film increases, and a voltage applied to a portion exhibiting ferroelectricity decreases. This undesirably lowers the efficiency.

As has been explained in detail above, in the invention according to a semiconductor device, the alignment of the La-containing region of the ferroelectric film is higher than that of the PZT film. This raises the alignment of the Pb-containing region present on this La-containing region. As a consequence, high reliability is obtained.

Also, in the invention according to a semiconductor device fabrication method, a base film not containing Pb can be formed with high alignment, and the alignment of this base film can be taken over to the ferroelectric film formed on the base film. That is, the alignment of the ferroelectric film is restrained by the alignment of the base film, so a ferroelectric film having high alignment can be obtained. This makes it possible to fabricate, e.g., a high-performance ferroelectric memory with high reliability.

What is claimed is:

1. A semiconductor device comprising:
   a semiconductor substrate;
   a lower electrode and upper electrode formed above said semiconductor substrate; and
   a ferroelectric film sandwiched between said lower and upper electrodes and having a perovskite crystal structure,
   wherein said ferroelectric film comprises:
   a La-containing region which is in contact with said lower electrode and contains La; and
   a Pb-containing region which is present on said La-containing region and contains Pb, and
   a La concentration in a lowermost surface of said La-containing region is higher than a La concentration in an uppermost surface of said Pb-containing region.

2. The semiconductor device according to claim 1, wherein no La is present in the uppermost surface of said Pb-containing region.

3. The semiconductor device according to claim 1, wherein a La concentration in said La-containing region monotonically decreases from a surface in contact with said lower electrode toward said upper electrode, or is constant.

4. The semiconductor device according to claim 1, wherein said La-containing region further contains at least one element selected form the group consisting of Pb and Zr.

5. The semiconductor device according to claim 3, wherein said La-containing region is made of an $LaTiO_3$ film.

6. The semiconductor device according to claim 5, wherein said $LaTiO_3$ film is an MOCVD film.

7. The semiconductor device according to claim 5, wherein said $LaTiO_3$ film is an MOCVD film, and the thickness thereof is not more than 20 nm.

8. The semiconductor device according to claim 1, wherein said Pb-containing region is made of a film selected from the group consisting of a $Pb(Zr, Ti)O_3$ film, $(Pb, La)(Zr, Ti)O_3$ film, $(Pb, Sr)(Zr, Ti)O_3$ film, $(Pb, Ca)(Zr, Ti)O_3$ film, $(Pb, La, Sr)(Zr, Ti)O_3$ film, $(Pb, La, Ca)(Zr, Ti)O_3$ film, $(Pb, Ca, Sr)(Zr, Ti)O_3$ film, and $(Pb, La, Ca, Sr)(Zr, Ti)O_3$ film.

9. The semiconductor device according to claim 1, wherein said lower electrode is made of Ir.

* * * * *